United States Patent [19]
Moretti et al.

[11] Patent Number: 5,522,005
[45] Date of Patent: May 28, 1996

[54] HIGH POWER WAVEGUIDE ABSORPTION MODULATOR

[75] Inventors: Anthony L. Moretti, Naperville; Frank A. Chambers, Warrenville, both of Ill.

[73] Assignee: E-Systems, Inc., Dallas, Tex.

[21] Appl. No.: 198,905

[22] Filed: Feb. 18, 1994

[51] Int. Cl.$^6$ ........................................ G02B 6/10
[52] U.S. Cl. ................ 385/129; 385/1; 385/14; 385/131; 257/22; 359/248; 437/107
[58] Field of Search ........................ 385/129, 130, 385/131, 132, 14, 122, 24, 39, 40, 45, 50, 1, 3; 359/276, 248; 257/25, 22; 437/105, 107

[56] References Cited

U.S. PATENT DOCUMENTS

| | | | |
|---|---|---|---|
| 4,525,687 | 6/1985 | Chemla et al. | 359/276 |
| 4,872,744 | 10/1989 | Abeles et al. | 359/276 |
| 5,274,246 | 12/1993 | Hopkins et al. | 359/248 X |
| 5,334,551 | 8/1994 | Komatsu | 385/130 X |

*Primary Examiner*—John D. Lee
*Assistant Examiner*—Phan T. H. Palmer
*Attorney, Agent, or Firm*—Rogers & Killeen

[57] ABSTRACT

A waveguide type electro-absorptive optical modulator that resists damage to its input facet and methods for minimizing or eliminating optical and electrical damage to the input facet of waveguide type electro-absorptive modulator by fabrication of an electrically isolated region in the modulator's waveguide proximate the input facet by forming an ion implantation region in at least one waveguide confinement rib proximate the input facet, a signal contact end on the at least one rib that is recessed from the plane of the input facet, or both.

40 Claims, 1 Drawing Sheet

HIGH POWER WAVEGUIDE ABSORPTION MODULATOR

FIELD OF THE INVENTION

The invention relates to optical waveguides that include electro-absorption, and more particularly to such waveguides that modulate the intensity of optical beams with high speed electrical data signals.

BACKGROUND OF THE INVENTION

Optical signal transmission of data can have advantages over electrical transmission of data, particularly when data must be transmitted at very high rates. These advantages are usually associated with the wide bandwidth required in the transmission system, wherein transmission lines used for electrical data transmission are more subject to noise and signal attenuation than the optical fibers used for optical data transmission.

Light sources for such optical data systems can be directly or indirectly modulated by electrical signals that represent the transmitted data. Indirect modulation involves the use of an optical modulator that responds to the electrical signals that represent the data to be transmitted. Such optical modulators are typically of the electro-absorptive, electro-dispersive, or phase-shift type. Regardless of type, the optical modulator is usually configured to cause a variation or shift in the intensity of the optical beam from the light source in some relationship to the electrical signals.

Compact optical data transmitters of the indirectly modulated type preferably comprise a laser diode light source that is coupled to an electro-absorptive waveguide type modulator. Typically, the electro-absorptive modulator operates by utilizing the shift in transmissivity of the modulator's waveguide to a longer wavelength due to the application of a strong electric field.

This shift occurs with modulator waveguides of several different semiconductor structures, such as when the structure of the waveguide comprises a bulk semiconductor, a single isolated quantum well, multiple isolated quantum wells, or multiple coupled quantum wells (a superlattice). With this type of modulator, the wavelength at which the modulator's waveguide changes from relatively transmissive to relatively opaque changes as a function of the potential of the electrical input signals applied to it.

Thus, for any given instantaneous potential applied to the electrical input of the modulator, there is a range of wavelengths of light that may be passed through the modulator's waveguide with relatively low absorption, a range of wavelengths with relatively high absorption, and a narrow range of wavelengths at which the characteristics of the waveguide shift from relatively transmissive to relatively absorptive, an "electro-absorptive edge" region.

If an operating wavelength for the light source is selected so that the change in potential of the electrical input signals, plus any applied bias potential, shifts or varies the electro-absorptive edge about this operating wavelength, a modulated optical signal that has a relatively large depth of modulation is generated by the modulator. The modulator is biased to shift the wavelengths of the electro-absorptive edge with respect to the operating wavelength so that a relatively small change in input signal causes a relatively large change in absorption of the modulator.

Such optical data transmitters often require substantial optical powers to be coupled into the modulator. For example, to provide a modulated output signal of between 100 microwatts and 1 milliwatt coupled into an optical fiber from the modulator may require approximately 10 to 20 milliwatts to be coupled into the modulator from the light source. Practical combinations of electrical input signal levels and optical input power can easily damage the modulator under ordinary operating conditions.

It has been determined that the damage that occurs to the modulator occurs primarily at or near the input facet of the modulator. This modulator damage may be reflected in its optical properties, its electrical properties, or both. The damage is believed to be due to excessive photo-current that is due to both the optical input power and the electrical signal input potential. Therefore, it is desirable to modify the construction of the modulator to minimize such damage to the modulator proximate its input facet under operating conditions.

SUMMARY OF THE INVENTION

The invention minimizes optical damage to an optical modulator with a construction that electrically isolates the input facet and proximate portion of its waveguide from the remainder of the modulator. In the preferred embodiment, this isolation is achieved by implanting a sufficient number of ions into a small portion of the modulator waveguide proximate the input facet of the modulator. The ion implanted region effectively electrically isolates the input region that comprises the facet and the portion of the waveguide between the input facet and the ion implanted region.

Even more effective electrical isolation of the input facet region is secured by limiting the length of the electrical input signal contact on the modulator to extend no closer than a certain minimum distance from the plane of the input facet on the modulator. This technique provides somewhat effective electrical isolation of the input facet region even when used without the ion implantation technique, in which instance the input facet region roughly comprises the portion of the waveguide that extends from the input facet to the recessed end of the input signal contact.

DESCRIPTION OF THE PREFERRED EMBODIMENTS

Figure 1:
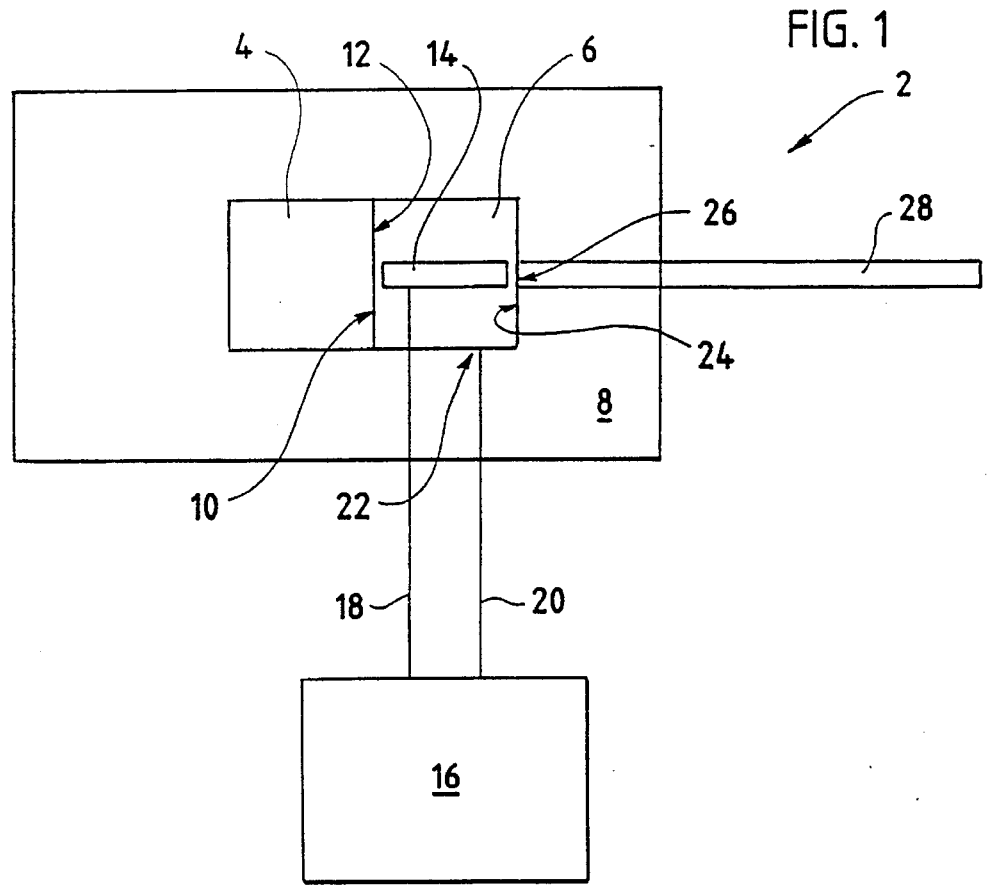
FIG. 1 shows a typical indirectly modulated optical data transmitter that is suitable for incorporating the invention.

FIG. 1 shows a typical indirectly modulated optical data transmitter 2 that is suitable for incorporating the invention. The transmitter 2 typically comprises a light source 4, an external electro-optical modulator 6, and a mounting substrate or sub-mount 8.

The light source 4 preferably comprises a laser diode that is butt-coupled to the modulator 6. Of course, the light source may comprise a separate solid state laser or other source that is suitably coupled to the modulator 6, such as by lens coupling through free space or by an optical fiber. The modulator 6 is preferably of the waveguide type, and it has an electrical signal input that changes the absorption or refractive index of the modulator's waveguide in some relationship to the application of an electrical signal that represents data to the modulator's electrical signal input.

The laser source 4 preferably has an output facet 10 that is butt-coupled to a corresponding input facet 12 of the modulator 6 to most effectively couple the light generated by the light source 4 into the modulator 6. The modulator 6 has at least one electrical input terminal 14 to allow an electrical data source 16 that is connected to the input terminal 14 via a signal wire 18 to modulate the intensity of the light that is coupled into it from the light source 4.

The circuit return between the data source 16 and the modulator 6 is typically made via a return wire 20 coupled between the data source 16 and a return terminal 22 on the substrate 8. The return terminal 22 is coupled to the return circuit of the modulator 6 in this case.

The modulator 6 also preferably has an output facet 24 that is butt-coupled to an end facet 26 of an optical transmission fiber 28 to effectively couple modulated light into the optical fiber. The output of the modulator 6 may also be coupled to the optical fiber 18 by other means, such as by lens coupling through free space.

Figure 2:
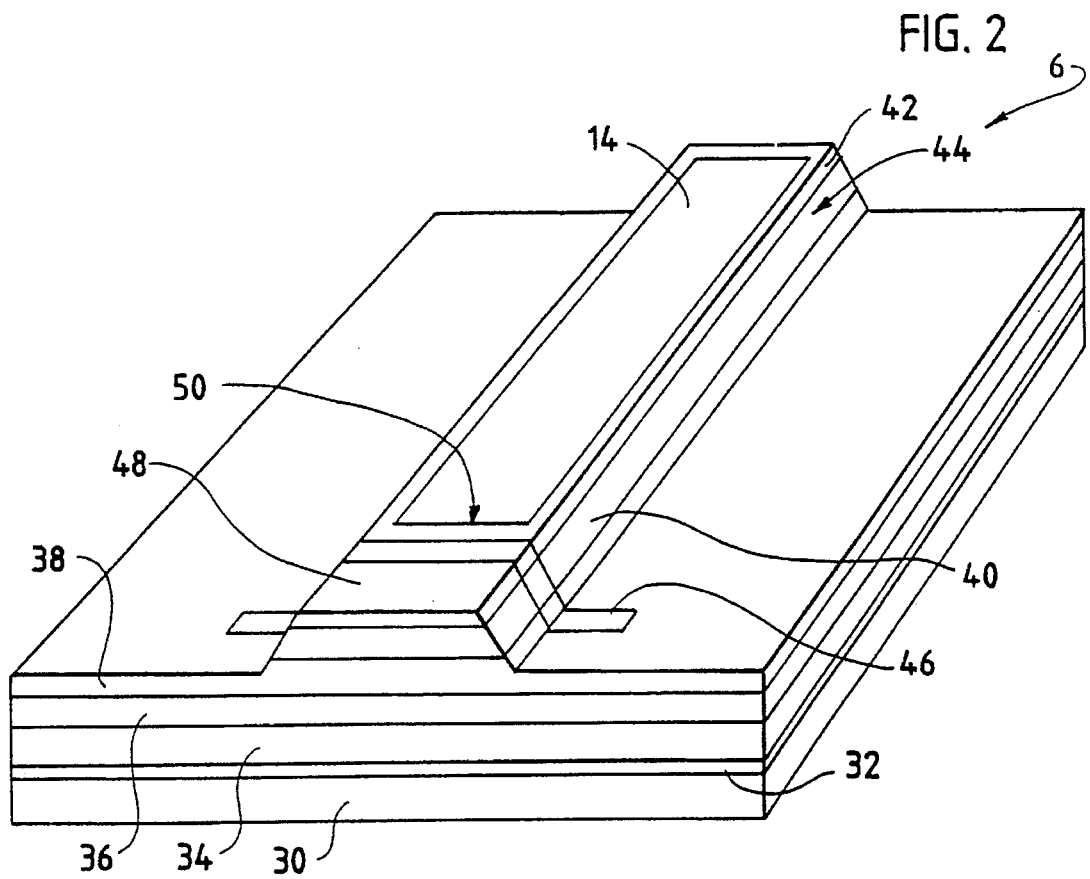
FIG. 2 shows an external optical modulator of the electro-absorption type that is configured according to the invention.

FIG. 2 shows the modulator 6 as described in connection with FIG. 1, wherein it is constructed according to a preferred embodiment of the invention. The modulator 6 preferably utilizes electro-absorption for modulation of the received from the light source 4, although the modulator 6 may use any other known modulation technique.

Although the modulator 6 is described, for convenience, as specifically a GaAs/$Al_xGa_{1-x}As$ type of absorption device, it will be apparent to those skilled in the art that the structure may comprise alternate semiconductor compositions, depending on the operating wavelength of the light provided by the light source 4, as recognized by those skilled in the art.

The modulator 6 is shown with the input facet 12 visible. The modulator 6 is fabricated on a modulator substrate 30. The substrate 30 conveniently comprises conductive GaAs. A GaAs buffer layer 32 is grown to a thickness of approximately 0.25 micrometer on one planar surface of the substrate 30, although a thickness anywhere in the range of approximately 0 to 2 micrometers is acceptable. The layer 32 is doped with donor ions, typically Si, to a concentration of approximately $n=1*10^{18}$ per cubic centimeter, although a concentration anywhere in the range of $n=1*10^{17}$ to $4*10^{18}$ per cubic centimeter, or a graded layer, is also acceptable.

Next, a lower cladding layer 34 of $Al_xGa_{1-x}s$ of composition $X_{clad}$ and thickness $h_{lc}$, wherein $X_{clad}$ and $h_{lc}$ are described below. The lower cladding layer 34 is also doped with donor ions, such as Si, to a concentration of approximately $n=1*10^{18}$ per cubic centimeter, although a concentration of approximately $n=1*10^{17}$ to $4*10^{18}$ per cubic centimeter, or a graded layer, is also acceptable. Over the lower cladding layer 34 is then grown a $Al_xGa_{1-x}As$ waveguide core layer 36 of composition $x_{core}$ and thickness $h_{core}$, wherein $x_{core}$ and $h_{core}$ are described below. The waveguide core layer 36 is left substantially undoped.

Over the waveguide core layer 36 is grown an inner upper cladding layer 38, followed by an outer upper cladding layer 40. The layers 38 and 40 are both $Al_xGa_{1-x}As$ of composition $x_{clad}$. The layer 38 has a thickness $h_{uc1}$ and the layer 40 has a thickness of $h_{uc2}$, wherein $h_{uc1}$ and $h_{uc2}$ are described below. Typically, the layer 38 is not intentionally doped so that it forms an intrinsic region within the core of the modulator 6. A thin cap layer 42 of approximately 0.1 micrometer thickness is grown over the layer 40.

The layers 40 and 42 are doped with acceptor ions, such as Be, C, Mg or Zn. Typically it is Be-doped to a concentration of approximately $p=1*10^{18}$ per cubic centimeter for layer 40 and $p=8*10^{18}$ per cubic centimeter for layer 42, although a concentration in the range of approximately $p=1*10^{17}$ to $2*10^{19}$ per cubic centimeter is also acceptable. Layers 38, 40 and 42 are etched to form at least one rib 44. To provide electrical isolation the rib 44 depth must be etched to below the dopant boundary between layers 38 and 40.

The thicknesses ($h_{lc}$, $h_{core}$, $h_{uc1}$, $h_{uc2}$) and compositions ($x_{clad}$, $X_{core}$) of the layers 32 through 40 described above are typically chosen so that light is guided in the core region of the modulator 6, as constrained along the core layer 36. Lateral confinement of the light within the core layer 36 is provided by the rib 44. Additionally, an absorption layer (not shown) is selected so that its electro-absorption edge straddles the chosen operating wavelength to provide a useful absorption to input signal amplitude transfer curve. This absorptive layer may be located within the core layer or within the cladding layers. The core layer and/or cladding layer structures may comprise, for instance, a bulk semiconductor composition, a single isolated quantum well, multiple isolated quantum wells, or multiple coupled quantum wells (a superlattice).

The thicknesses of the layers 38 and 40, $h_{uc1}$ and $h_{uc2}$ respectively, are chosen to strike a balance between a large electric field and a single lateral optical mode when the rib 44 is etched into the layers 38, 40 and 42. For a given applied input signal potential to the modulator 6, the electric field increases as $h_{uc1}$ decreases, and thus it is advantageous to decrease $h_{uc1}$ to decrease the operating potential. To provide electrical isolation of the rib 42, etching must extend below the dopant boundary between layers 38 and 40. If the etch is too deep, multiple lateral modes will be allowed, and this may adversely affect performance.

For instance, to fabricate the modulator 6 for a large change in refractive index, and therefore absorption, using an operating wavelength of approximately 855 nanometers, $X_{clad}$ is approximately 0.123 micrometers, $h_{lc}$ is approximately 1.00 micrometers, $x_{core}$ is approximately 0.062 micrometers, $h_{uc1}$ is approximately 0.50 micrometers and $h_{uc2}$ is approximately 0.50 micrometers. To fabricate a modulator 6 for a moderate change in refractive index, and therefore absorption, using an operating wavelength of approximately 855 nanometers, $x_{clad}$ is approximately 0.086 micrometers, $h_{lc}$ is approximately 2.00 micrometers, $x_{core}$ is approximately 0.062 micrometers, $h_{uc1}$ is approximately 0.65 micrometers and $h_{uc2}$ is approximately 0.35 micrometers. In both of these cases the absorptive layer is located within the core layer 36.

The width of the rib 44 is approximately 5 micrometers, although any value of width in the range of approximately 1 to 20 micrometers is acceptable. The thickness of the contact 14 is approximately 0.25 micrometers, although any value of thickness in the range of approximately 0.5 to at least 5 micrometers is acceptable. The width of the contact 14 is approximately 3 micrometers, although any value of width in the range of approximately 1 to 20 micrometers is also acceptable. The depth of the etch is determined by the device structure and desired optical mode structure, as will be appreciated by those skilled in the art.

At least a portion of the surface of rib 44 is bombarded with ions from a proton ion source to form an ion implantation region 46 that at least fully penetrates the doped upper layer that comprises the rib 42. Typically, the protons are implanted to a concentration of approximately $1*10^{15}$ per cubic centimeter with an energy in the range of approximately 50 to 85 keV. Of course, other ion sources are also usable to form the ion implantation region 46, as will be appreciated by those skilled in the art. In any case, the actual energies and concentrations of the implanted ions will be determined by the actual concentration and profiles of the dopant layers.

The implantation region 46 is formed close to the input face 12, to create an electrically isolated portion 48 of the waveguide rib 44. Typically, the width of the implantation region 46 is approximately 30 micrometers, and its length is approximately 10 micrometers. The length of the isolated portion 48 should be no less than approximately 25 micrometers, preferably in the range of approximately 50 to 200 micrometers, and not more than approximately 1000 micrometers. A value of approximately 85 micrometers is typical.

An end 50 of the signal contact 14 proximate the input facet 12 should extend no further than the boundary of the implantation region 46 to insure electrical isolation. Further resistance to electrical failure is secured by reducing the length of the input signal contact 14 so that the end 50 does not extend all the way to the boundary of the implantation region 46. The recession of the end 50 of the contact 14 from the implantation region 46 in this case should preferably be no closer than approximately 5 micrometers.

In an alternate embodiment of the invention, the modulator 6 may be used without the ion implantation region 46 if the end 50 of the contact 14 is sufficiently recessed from the plane of the input facet 12. The recession of the end 50 of the contact 14 serves to provide a degree of isolation within the isolated portion 48 then defined as approximately the distance from the end 50 of the contact 14 to the input facet 12. In this case, the recession of the end 50 of the contact 14 from the input facet 12 should be no closer than approximately 20 micrometers from the input facet 12.

Thus, there has been described herein a waveguide type electro-absorptive optical modulator that resists damage to its input facet and methods for minimizing or eliminating damage to the input facet of a waveguide type electro-absorptive modulator by fabrication of an electrically isolated region in the modulator's waveguide proximate the input facet by forming an ion implantation region in at least one waveguide confinement rib proximate the input facet, a signal contact end on the at least one rib that is recessed from the plane of the input facet, or both. The embodiments described above should not be construed as limiting the scope of the invention because they are only made as specific examples of the implementation of the invention as claimed. It should be understood that various changes in the details, parts, materials, processing and fabrication of the invention as described above may be made while remaining within the scope of the claimed invention.

What is claimed is:

1. A method of preventing damage to a multiple layer semiconductor optical modulator of the electro-absorption type that comprises at least a waveguide core layer, an input facet for transmission of light through said waveguide layer, and at least one cladding layer that is ribbed for lateral confinement of the light that passes through said waveguide core layer, wherein an outer portion of at least one rib in said at least one cladding layer is impurity doped, and that comprises the steps of:

selecting a distance for a portion of said at least one rib in said at least one cladding layer that extends along said at least one rib from said input facet to electrically isolate a portion of said waveguide layer from the rest of said waveguide layer; and implanting ions to form an ion implantation region through and across said impurity doped layer of said at least one rib at a point along said at least one rib that is approximately said selected distance from said input facet to define the boundaries of said isolated portion of said waveguide layer that protects said modulator from damage.

2. The method set forth in claim 1, wherein said waveguide core layer comprises a bulk structure.

3. The method set forth in claim 1, wherein said waveguide core layer comprises an isolated quantum well structure.

4. The method set forth in claim 1, wherein said waveguide core layer comprises a multiple isolated quantum well structure.

5. The method set forth in claim 1, wherein said waveguide core layer comprises a multiple coupled quantum well structure.

6. The method set forth in claim 1, wherein said at least one cladding layer comprises a bulk structure.

7. The method set forth in claim 1, wherein said at least one cladding layer comprises a single isolated quantum well structure.

8. The method set forth in claim 1, wherein said at least one cladding layer comprises a multiple isolated quantum well structure.

9. The method set forth in claim 1, wherein said at least one cladding layer comprises a multiple coupled quantum well structure.

10. The method set forth in claim 1, wherein said at least one cladding layer comprises a plurality of said impurity doped ribs.

11. The method set forth in claim 1, wherein said at least one rib has a metallic input signal layer over said at least one rib, and that further comprises the step of configuring the length of said input signal layer to have an end recessed from said input facet along said at least one rib by at least said distance of said implantation region from said facet.

12. The method set forth in claim 11, wherein said waveguide core layer comprises a bulk structure.

13. The method set forth in claim 11, wherein said waveguide core layer comprises an isolated quantum well structure.

14. The method set forth in claim 11, wherein said waveguide core layer comprises a multiple isolated quantum well structure.

15. The method set forth in claim 11, wherein said waveguide core layer comprises a multiple coupled quantum well structure.

16. The method set forth in claim 11, wherein said at least one cladding layer comprises a bulk structure.

17. The method set forth in claim 11, wherein said at least one cladding layer comprises a single isolated quantum well structure.

18. The method set forth in claim 11, wherein said at least one cladding layer comprises a multiple isolated quantum well structure.

19. The method set forth in claim 11, wherein said at least one cladding layer comprises a multiple coupled quantum well structure.

20. The method set forth in claim 11, wherein said at least one cladding layer comprises a plurality of said impurity doped ribs.

21. A multiple layer semiconductor optical modulator of the absorption type that is resistant to optical and electrical damage, that comprises at least a waveguide core layer, an input facet for transmission of light through said waveguide layer, and at least one cladding layer that is ribbed for lateral confinement of the light that passes through said waveguide core layer, wherein an outer portion of at least one rib in said at least one cladding layer is impurity doped, and also comprises:

an ion implantation region that extends through and across said impurity doped layer of said at least one rib at a point along said at least one rib that is approximately a preselected distance from said input facet to define the boundaries of an electrically isolated portion of said waveguide layer extending from said input facet to approximately said preselected distance that protects said modulator from damage.

22. The modulator set forth in claim 21, that further comprises a metallic input signal layer that is applied over at least a portion of said at least one rib that has an end recessed from said input facet along said at least one rib by at least said distance of said implantation region from said facet.

23. The modulator set forth in claim 22, wherein said waveguide core layer comprises a bulk structure.

24. The modulator set forth in claim 22, wherein said waveguide core layer comprises an isolated quantum well structure.

25. The modulator set forth in claim 22, wherein said waveguide core layer comprises a multiple isolated quantum well structure.

26. The modulator set forth in claim 22, wherein said waveguide core layer comprises a multiple coupled quantum well structure.

27. The modulator set forth in claim 22, wherein said at least one cladding layer comprises a bulk structure.

28. The modulator set forth in claim 22, wherein said at least one cladding layer comprises a single isolated quantum well structure.

29. The modulator set forth in claim 22, wherein said at least one cladding layer comprises a multiple isolated quantum well structure.

30. The modulator set forth in claim 22, wherein said at least one cladding layer comprises a multiple coupled quantum well structure.

31. The modulator set forth in claim 22, wherein said at least one cladding layer comprises a plurality of said impurity doped ribs.

32. The modulator set forth in claim 21, wherein said waveguide core layer comprises a bulk structure.

33. The modulator set forth in claim 21, wherein said waveguide core layer comprises an isolated quantum well structure.

34. The modulator set forth in claim 21, wherein said waveguide core layer comprises a multiple isolated quantum well structure.

35. The modulator set forth in claim 21, wherein said waveguide core layer comprises a multiple coupled quantum well structure.

36. The modulator set forth in claim 21, wherein said at least one cladding layer comprises a bulk structure.

37. The modulator set forth in claim 21, wherein said at least one cladding layer comprises a single isolated quantum well structure.

38. The modulator set forth in claim 21, wherein said at least one cladding layer comprises a multiple isolated quantum well structure.

39. The modulator set forth in claim 21, wherein said at least one cladding layer comprises a multiple coupled quantum well structure.

40. The modulator set forth in claim 21, wherein said at least one cladding layer comprises a plurality of said impurity doped ribs.

* * * * *